United States Patent [19]

Adams et al.

[11] 4,064,474
[45] Dec. 20, 1977

[54] IMPEDANCE RATIO VARYING DEVICE

[75] Inventors: Guy Emery Adams, Monroe; Donald Alexander MacPhedran, Tappan, both of N.Y.

[73] Assignee: Solitron Devices, Inc., Tappan, N.Y.

[21] Appl. No.: 740,311

[22] Filed: Nov. 9, 1976

[51] Int. Cl.² .......................................... H01F 29/06
[52] U.S. Cl. ..................................... 336/139; 343/861
[58] Field of Search .............. 343/749, 750, 860, 821, 343/861, 895; 336/139, 140, 141

[56] References Cited

U.S. PATENT DOCUMENTS 2,814,023 11/1957 Alexy .................................... 336/141
2,855,599 10/1958 Kandoian ............................ 343/861
2,948,894 8/1960 Carpenter ........................... 343/895

FOREIGN PATENT DOCUMENTS 317,868 1917 Germany ............................ 336/141
720,960 12/1954 United Kingdom ................ 336/139

Primary Examiner—Alfred E. Smith
Assistant Examiner—Harry Barlow
Attorney, Agent, or Firm—Richard G. Geib

[57] ABSTRACT

A compact arrangement having concentric loading element and coupling element with the latter forming a bearing support for a revolvable member mounting the former.

7 Claims, 3 Drawing Figures

IMPEDANCE RATIO VARYING DEVICE

BACKGROUND

It has long been an object of the prior art to obtain a match for impedance of an RF source to that of a line or antenna. See U.S. Pat. No. 2,855,599 as a teaching of a way to arrive at this object and for the reasons such is desirable.

However, while this has been a long standing object, no one is known prior to this invention to have found a practical, inexpensive and compact means of packaging such elements to permit universal economical utilization. It is therefore the principal object of this invention to obtain a compact concentric operative relationship of loading coil and coupling coil for impedance matching of an RF source to a line or antenna.

DRAWING DESCRIPTION

DETAILED DESCRIPTION

Figure 1:
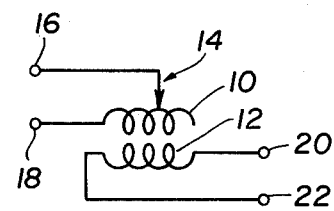
FIG. 1 is a simple schematic design of an impedance matching circuit according to this invention.

With more particular reference to FIG. 1 there is shown a loading coil 10 operatively related to a coupling coil 12 such that varying the resolution ratio of coils 10 and 12 may be scheduled by a commutator 14 between the line and ground terminals 16 and line 18 respectively. With such circuits a pair of terminals 20, 22 connect a signal source or receiver to the coupling coil.

Such structure makes it possible to find a specific match for the transmission line and load. Specific utility is found for this invention in impedance matching an antenna and/or a transmission line to an RF source.

Figure 2:
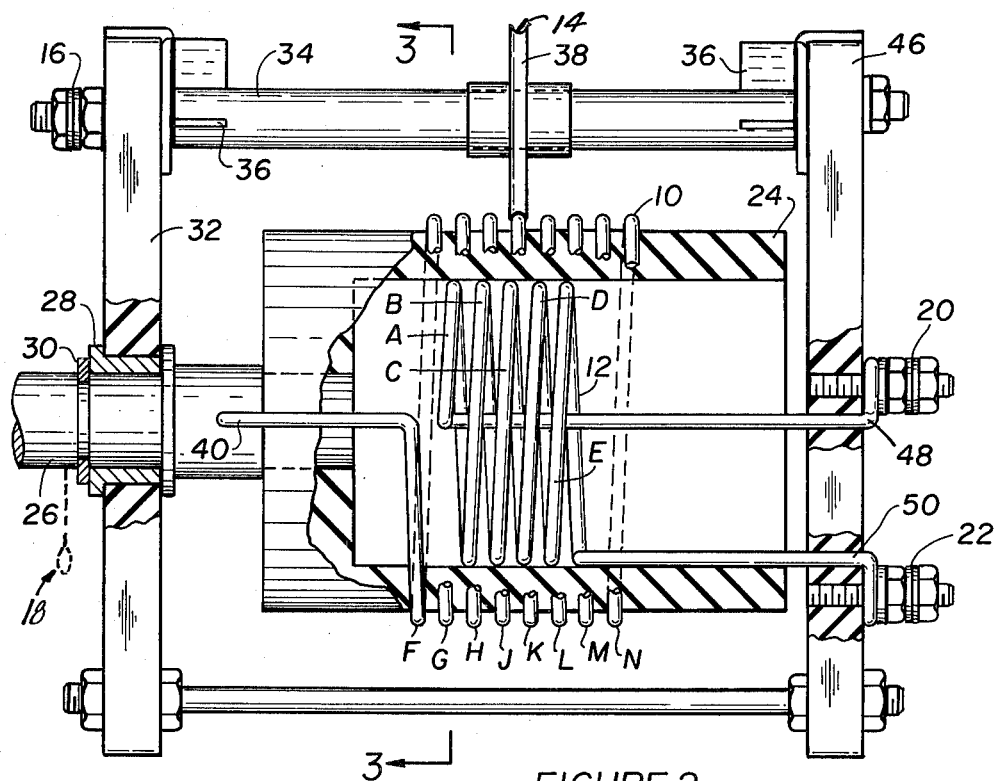
FIG. 2 is a plan view with some elements partially shown in cross-section for clarity of element relationships of a package concept for the circuit of FIG. 1 in accordance with this invention.

Turning now to FIG. 2 there the structure is shown by which this invention may be realized. Specifically, the loading coil 10 is mounted about an insulator 24. A shaft 26 is connected to the insulator 24 to rotate same. As seen, the shaft is supported by a bearing block 28 in an end piece and held thereto by a retaining ring 30. Shaft 26 is connected to a ground source as by a sliding contact (not shown) or any other well known means available to one skilled in the art. This could even be by an end frame where one does not, as here, use an end frame 32 to also support commutating wheel shaft 34.

Shaft 34 as shown has an antenna terminal 16 on one end and supports a commutating wheel 38 such that it may move axially in providing a variable length circuit connection of terminal 16 to loading coil 10. Loading coil 10 has one end 40 connected to shaft 26 to ground.

Figure 3:
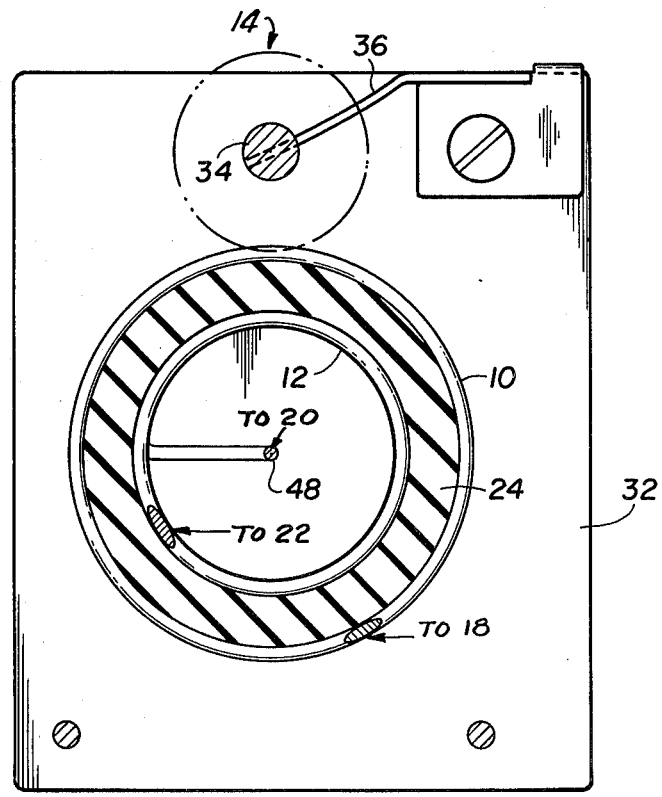
FIG. 3 is an end view along lines 3—3 of FIG. 2.

Actually shaft 34, as may be best seen by FIG. 3 is supported by spring plates 36 so that wheel 38 has a forced contact with coils of loading coil 10. This will then present side loads on insulator 24, which if no other support is used, would have to be accepted and absorbed by the bearing block 28 supporting shaft 26. However, by appropriate sizing of coupling coil 12 diameter the hollow insulator will have a spaced support between bearing block 28 and the individual coils A, B, C, D and E of coupling coil 12. This allows one to use a spring bias for wheel 38 that will insure a scrubbing contact of wheel 38 and coils F, G, H, J, K, L, M and N of load coil 10. Therefore any tendency to lessen the electrical continuity is prevented.

The transmission line or RF source terminals are brought through end-frame 46 as at 48 and 50.

OPERATION

Using the familiar expression for the resolution ratio:

$$\left(\frac{N_1}{N_2}\right)^2 RL$$

where
$N_1$ equals the turns of coil 10,
$N_2$ equals the turns of coil 12, and
RL equals the load across 16 and 18.

It may thus be realized with the structure of this invention and with the couple of coils 10 and 12 being an air coil, that it is possible in high frequency devices to obtain continuous variance and an infinite number of impedance resolution ratios from less than one to, with the use of an 8 to 4 ratio shown, two, and any fractional ratio between 0 and 2.

It may also be realized that the air core could be replaced with a ferrite or like material core for similar operation with low frequency devices.

What is claimed is:

1. In a device for impedance matching a line and load a means to integrate the package of needed elements, said means comprising:
   end support means;
   a first shaft revolvably supported by at least a portion of said end support means;
   a second shaft;
   means to support said second shaft by the end support means;
   an insulating hollow block mounted to said first shaft to rotate therewith;
   a first coil electrically connected to said first shaft and wound about said block to be supported thereby;
   a commutating wheel rotatably supported on for axial movement along said second shaft, said wheel bridging said second shaft and said first coil to define a path length of said first coil; and
   a second coil mounted by said end support means to project within and rotatably support said block and underly said first coil.

2. The structure of claim 1 where in said means to support said second shaft is a spring means to maintain bias for the contact between said wheel and said first coil.

3. The structure of claim 2 wherein said second shaft has an electrical connector for the connection of a line therewith.

4. The structure of claim 3 wherein the second coil has its ends terminating in electrical connections for a load.

5. An impedance matching device for an antenna and a signal means, said device comprising:
   a plurality of end support means;
   a coupling coil connected to terminals for the signal means extending from one end support means towards the other end support means;
   a hollow insulating ring rotatably supported on said coupling coil;

a load coil supported by said ring over said coupling coil;

a shaft connected to said ring and rotatably supported by the other end support means, said shaft being connected to said load coil such that rotation of said shaft will rotate said load coil means; and commutator means connected with an antenna terminal, said commutator means being biased to contact said load coil and move along same to infinitely vary the number of impedance resolution ratios to get the one desired for the antenna and signal means.

6. The device of claim 5 wherein the commutator means connected with an antenna terminal is a wheel resiliently biased in electrical contact with said load coil whereby rotation of said load coil will rotate said wheel to cause it to be axially movable from end to end of said load coil for infinite path length adjustment of an electrical circuit of said antenna terminal load coil and said shaft.

7. An antenna tuning and coupling unit for coupling energy over a wide band of frequencies from a signal source to an antenna terminal comprising:

a load coil in series with the antenna terminal, said load coil being revolvably supported by an insulator mounted by a revolvable shaft forming a ground connection for the load coil;

a commutating wheel biased onto said load coil so as to be in electrical contact therewith and upon a revolution of same provide adjustment of the electrical length of the coil;

a coupling coil located within the confines of the loading coil, said coupling coil being of a diameter to be an internal bearing support for said insulator, said coupling coil being in the path of the signal source.

* * * * *